(12) United States Patent
Maltabas et al.

(10) Patent No.: US 11,031,945 B1
(45) Date of Patent: Jun. 8, 2021

(54) TIME-TO-DIGITAL CONVERTER CIRCUIT LINEARITY TEST MECHANISM

(71) Applicant: Apple Inc., Cupertino, CA (US)

(72) Inventors: Samed Maltabas, Santa Clara, CA (US); Yu Chen, Santa Clara, CA (US); Dennis M. Fischette, Jr., Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/019,028

(22) Filed: Sep. 11, 2020

(51) Int. Cl.
*H03M 1/10* (2006.01)
*G04F 10/00* (2006.01)
*H03L 7/081* (2006.01)
*H03L 7/085* (2006.01)

(52) U.S. Cl.
CPC ........ *H03M 1/1071* (2013.01); *G04F 10/005* (2013.01); *H03L 7/081* (2013.01); *H03L 7/085* (2013.01)

(58) Field of Classification Search
CPC ................................ H03L 7/081; H03L 7/085
USPC .................................. 327/147–149, 156–158
See application file for complete search history.

(56) References Cited

U.S. PATENT DOCUMENTS

| | | | |
|---|---|---|---|
| 8,261,619 B2 | 9/2012 | Shin et al. | |
| 9,362,936 B1 | 6/2016 | Caffee et al. | |
| 9,537,585 B2 | 1/2017 | Mayer et al. | |
| 10,459,407 B1* | 10/2019 | Degani | H03M 1/1004 |
| 10,840,921 B2* | 11/2020 | Konradsson | H03B 5/1212 |
| 10,862,489 B2* | 12/2020 | van den Heuvel | H03C 3/0941 |
| 2011/0084863 A1* | 4/2011 | Chiu | G04F 10/005 341/141 |
| 2011/0140737 A1* | 6/2011 | Rivoir | G04F 10/005 327/12 |
| 2011/0156783 A1* | 6/2011 | Pavlovic | H03L 7/18 327/159 |
| 2014/0266848 A1* | 9/2014 | Henzler | G04F 10/005 341/166 |
| 2016/0359493 A1* | 12/2016 | Chen | H03L 7/093 |
| 2017/0205772 A1* | 7/2017 | Burg | H03L 7/0991 |
| 2018/0062660 A1* | 3/2018 | van den Heuvel | G04F 10/005 |
| 2018/0145692 A1* | 5/2018 | Doare | G01S 7/35 |
| 2018/0181077 A1* | 6/2018 | Salle | H03L 7/085 |
| 2018/0183447 A1* | 6/2018 | Sim | H03L 7/081 |
| 2019/0052278 A1* | 2/2019 | Pandita | G06F 1/08 |
| 2019/0074842 A1* | 3/2019 | Sun | H03L 7/197 |
| 2019/0199361 A1* | 6/2019 | Sudalaiyandi | H03K 5/131 |
| 2019/0334534 A1* | 10/2019 | Kitamura | H03L 7/10 |

(Continued)

*Primary Examiner* — Adam D Houston
(74) *Attorney, Agent, or Firm* — Kowert, Hood, Munyon, Rankin & Goetzel, P.C.

(57) ABSTRACT

A phase-locked loop circuit included in a computer system includes time-to-digital converter and digital-to-time converter circuits. During a mode to test the time-to-digital converter circuit, the digital-to-time converter circuit is coupled to the time-to-digital converter circuit in a loopback fashion. A control circuit supplies stimulus codes to the digital-time-converter circuit, which generates multiple delayed versions of a reference clock signal using the stimulus codes. The time-to-digital converter circuit, in turn, generates capture codes based on the delay between the reference clock signal and the delayed versions of the reference clock signal. The control circuit compares the capture codes to the stimulus codes to determine a linearity of a response of the time-to-digital converter circuit.

20 Claims, 9 Drawing Sheets

(56) References Cited

U.S. PATENT DOCUMENTS

| | | | |
|---|---|---|---|
| 2020/0195261 A1* | 6/2020 | Khoury | H03B 5/1265 |
| 2020/0310359 A1* | 10/2020 | Yuan | H03K 3/0315 |
| 2020/0321968 A1* | 10/2020 | Yeo | H03L 7/085 |
| 2021/0013888 A1* | 1/2021 | Kim | H03L 7/095 |
| 2021/0026309 A1* | 1/2021 | Elkholy | G04F 10/005 |

* cited by examiner

TIME-TO-DIGITAL CONVERTER CIRCUIT LINEARITY TEST MECHANISM

BACKGROUND

Technical Field

This disclosure relates generally to phase-locked loop circuits in computer systems and, more particularly, to testing the linearity of a time-to-digital converter circuit in a digital phase-locked loop circuit.

Description of the Related Art

Computer systems often employ periodic signals (often referred to as "clock signals") to relay timing information to different circuits included in such computer systems. The timing information may be used, for example, by latch or flip-flop circuits to sample and hold data. Additionally, the timing information may be used in sending and receiving data between different circuit blocks within an integrated circuit, or between different integrated circuits.

Clock signals may be generated using a variety of circuits and techniques. In some cases, a reference clock signal may be generated using a crystal oscillator circuit. Phase-locked loop (PLL) or delayed-locked loop (DLL) circuits may in turn be employed to generate other clock signals of differing frequencies and phases relative to the reference clock signal.

Clock generator circuits, such as those described above, may include any suitable combination of oscillator circuits, frequency divider circuits, frequency and/or phase comparison circuits, filter circuits, and the like. In some cases, clock generator circuits may employ time-to-digital converter circuits as part of a phase comparison circuit. A time-to-digital converter may be used in a digital phase-locked loop circuit to replace the phase comparison and charge pump circuits, by generating a digital value that corresponds to the phase difference between the output clock signal and the reference clock signal. The digital value may then be digitally filtered before it is used to adjust a frequency of an oscillator circuit included in the digital phase-locked loop circuit

SUMMARY OF THE EMBODIMENTS

Various embodiments of a test circuit for a time-to-digital converter circuit are disclosed. Broadly speaking, a test circuit includes a control circuit that is configured to generate a plurality of stimulus code values when a test mode is activated. A digital-to-time converter circuit is configured to generate a delayed signal using a reference clock signal in combination with a given stimulus code, which specifies the intended delay. The time-to-digital converter circuit is configured to generate a captured code that digitally encodes a value of a delay between the delayed signal and the reference clock signal. The control circuit is further configured to perform a test operation using the stimulus code and the captured code. By using a set of stimulus codes that generate delayed signals that span the range of possible input phase differences for the time-to-digital converter circuit, the linearity of the output codes generated by the time-to-digital converter circuit may be determined. The linearity of the output codes may be used to calibrate a phase-locked loop circuit that includes the time-to-digital converter circuit, so that non-linearities in the response of the time-to-digital converter circuit can be anticipated and circuit operation adjusted accordingly.

DETAILED DESCRIPTION OF EMBODIMENTS

Figure 1:
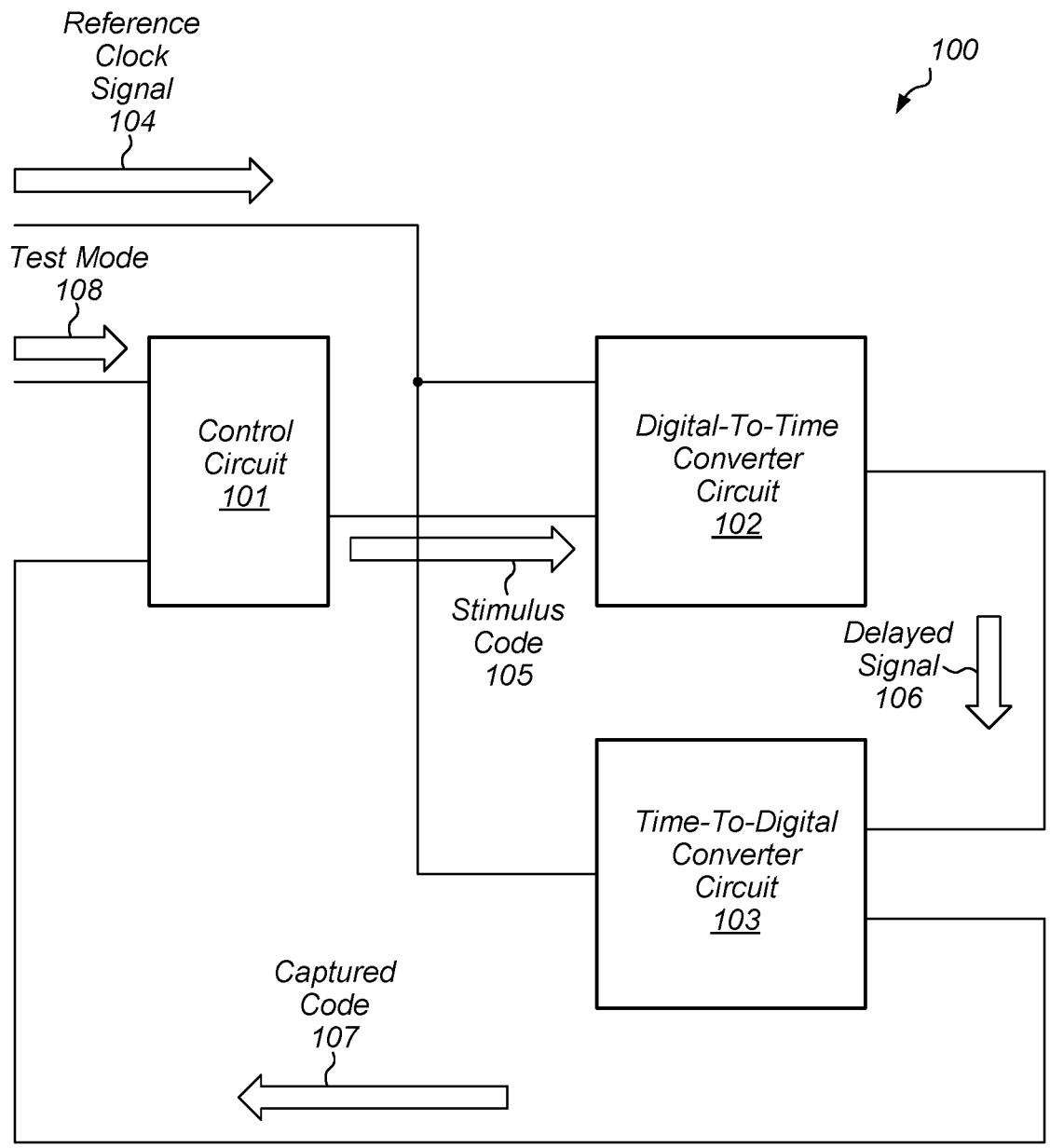
FIG. 1 is a block diagram of an embodiment of a time-to-digital linearity test circuit.

Many computer systems employ clock generator circuits to generate various clock signals to be used as timing references within the computer system by various circuits. Among these clock generator circuits are phase-locked loop circuits (PLLs), which use a reference clock signal (often generated by a crystal oscillator circuit) to generate clock signals with frequencies that are multiples of the reference clock signal frequency. Some circuits in the computer systems use either the rising edge or the falling edge of a clock signal, while other circuits, such as double-data-rate memory devices, use both the rising and falling edges of a clock signal. Duty cycle distortion of a clock signal can adversely affect the performance of circuits that use both edges of the clock signal.

Clock jitter is a deviation of the clock signal rising and falling edges from their respective desired positions in time. Duty cycle distortion may be one of several contributors to clock jitter. Fractional-N PLLs allow the frequency of an output clock signal to be a non-integer multiple of the frequency of the reference clock signal. A significant drawback to fractional-N PLLs is that they generate undesirable spurious tones on the output clock, which increases clock jitter.

In many cases, a digital PLL is used to implement a fractional-N PLL. In digital PLLs, a time-to-digital converter (TDC) circuit replaces a phase detector and charge pump circuits typically found in traditional analog PLLs. The TDC circuit measures and digitizes the phase error, which is the time delay between the reference clock signal and feedback clock edges at the input to the TDC circuit. The digitized phase error determined by the TDC circuit is filtered, and used to control a voltage-controlled oscillator circuit that is configured to generate an output clock of the digital PLL.

The TDC circuit is a highly-sensitive component in a digital PLL. In particular, the linearity of the TDC circuit's response has a significant effect on the quality of the digital PLL output clock. Specifically, non-linearities in the response of a TDC circuit may increase jitter in the PLL output clock. To calibrate circuits that use a clock signal generated by a digital PLL, as well as to evaluate the design of a digital PLL, it is important to accurately measure the linearity of the response of the TDC circuit. As used herein, the "linearity" of the response of a TDC circuit refers to how closely the digital output of the TDC circuit, as a function of the delay between its input signals, resembles a straight line.

Another sub-circuit commonly employed in digital PLLs is a digital-to-time converter (DTC) circuit. A DTC circuit is configured to generate a delayed version of an input signal using a digital control word that specifies and encodes a delay between the input signal and its delayed version. In some digital PLL designs, a TDC circuit may be employed to quantify the phase error, while a DTC circuit may be employed to reduce the magnitude of fractional-N spurious signals going into the TDC. The more linear the response of the TDC circuit, the more effective the technique becomes in reducing spurious signals.

Techniques described below in the present disclosure arrange a TDC circuit and a DTC circuit in a loop-back configuration during a test mode, such that the DTC circuit can provide stimulus, in the form of delayed signals, to the TDC circuit, thereby allowing the TDC circuit to be tested. By varying the digital control words supplied to the DTC circuit, a range of delayed signals may be generated that can be used to determine the response of the TDC circuit. Techniques used in the present disclosure rely on comparing the digital outputs of the TDC circuit to the digital control words supplied to the DTC, to measure the linearity of the response of the TDC circuit in order to determine if a given digital output of the TDC circuit falls within a specified range around the corresponding digital control word supplied to the DTC circuit. Such knowledge of the linearity of the response of the TDC circuit may be used to compensate for non-linear behavior in the TDC, or to improve future TDC circuit designs.

FIG. 1 is a block diagram of an embodiment of a time-to-digital linearity test circuit. As illustrated, time-to-digital linearity test circuit 100 includes control circuit 101, digital-to-time converter circuit 102, and time-to-digital converter circuit 103. In various embodiments, time-to-digital linearity test circuit 100 may be included in a phase-locked loop circuit or other circuits that employ a time-to-digital converter circuit.

Control circuit 101 is configured to generate stimulus code 105 in response to an activation of a test mode 108. In various embodiments, stimulus code 105 may encode an amount of time by which reference clock signal 104 in digital-to-time converter circuit 102 is to be delayed to generate delayed signal 106. In various embodiments, stimulus code 105 may include multiple bits whose collective value is indicative of a desired amount of the delay between reference clock signal 104 and delayed signal 106. In some embodiments, stimulus code 105 may be encoded to reduce the number of bits needed to represent a particular delay value. Although control circuit 101 is depicted as generating a single stimulus code, in other embodiments, control circuit 101 may be configured to generate any suitable number of stimulus codes. The values of such stimulus codes may be limited to the allowable range of delay values that digital-to-time converter circuit 102 is able to generate.

Digital-to-time converter circuit 102 is configured to generate delayed signal 106 using reference clock signal 104 and stimulus code 105. In various embodiments, digital-to-time converter circuit 102 may include a delay line (also referred as a "delay chain") configured to generate multiple delayed signals. As described below, a delay line is a structure that includes a series of sequentially connected "delay stages" or "delay elements." Each delay stage is a structure that produces some amount delay; the total delay generated by a delay line corresponds to the sum of delays generated by the constituent delay stages within the delay line. In various embodiments, a delay stage may be a single inverter or a pair of inverters. Digital-to-time converter circuit 102 may also include a multiplex circuit configured to select, using stimulus code 105, a particular one of the generated delayed signals to generate delayed signal 106.

Time-to-digital converter circuit 103 is configured to generate captured code 107 using delayed signal 106 and reference clock signal 104. Captured code 107 includes multiple bits whose value is indicative of the time delay between reference clock signal 104 and delayed signal 106. Various techniques may be employed to generate captured code 107. As described below, time-to-digital converter circuit 103 may employ circuits (referred to herein as "capture circuits") to capture, using delayed versions of reference clock signal 104, the respective states of delayed versions of delayed signal 106. The captured states can be used to generate captured code 107. Time-to-digital converter circuit 103 may activate, using corresponding ones of the phase signals, the capture circuits, to capture a state corresponding to one of the delayed versions of delayed signal 106. Contents of the capture circuit may be used to generate captured code 107.

Control circuit 101 is further configured to compare stimulus code 105 with captured code 107. As described below, control circuit may perform additional operations (e.g., decoding, generating a tolerance window, etc.) in order to compare stimulus code 105 to captured code 107. A tolerance window is the maximum acceptable amount of difference between stimulus code 105 and the corresponding captured code 107. By comparing multiple stimulus codes 105 to corresponding capture codes 107, control circuit 101 may be able to determine how linear the response of time-to-digital converter circuit 103 is. In this case, the "linearity" the response of a time-to-digital converter circuit 103 is how closely the digital output of the time-to-digital converter circuit, as a function of the delay between its input signals, resembles a straight line. Such information regarding the linearity of time-to-digital converter circuit 103 may be stored in a memory circuit or other storage device (both not shown), and may be used to calibrate circuits that use an output of time-to-digital converter circuit 103, as well as to evaluate the quality of a design of time-to-digital converter circuit 103. Although testing the linearity of time-to-digital converter circuit 103 is discloses, it is contemplated that the method may be used to test the linearity of digital-to-time converter circuit 102 by using time-to-digital converter circuit 103 to provide stimulus to digital-to-time converter circuit 12.

Figure 2:
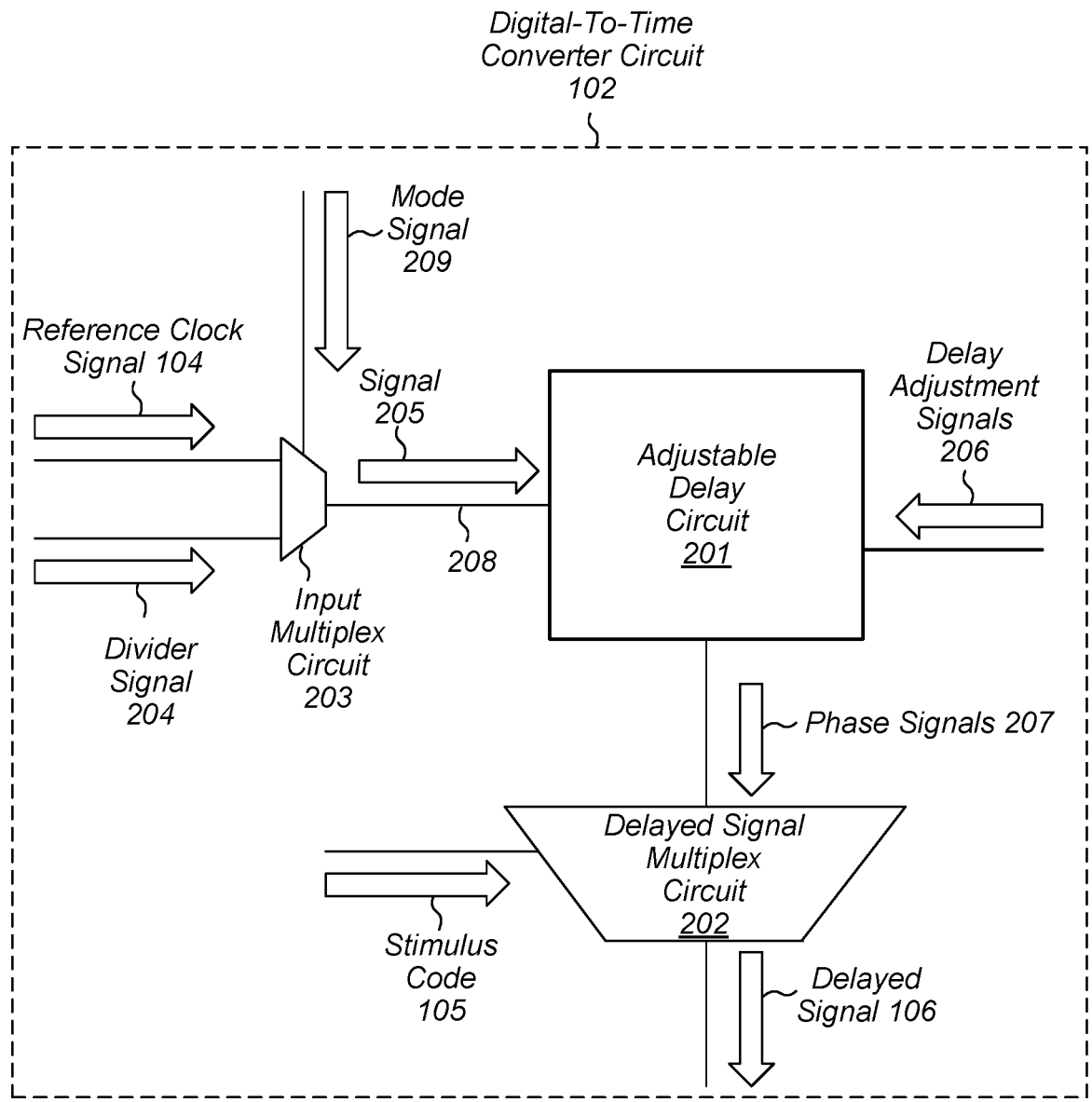
FIG. 2 illustrates a block diagram of an embodiment of a digital-to-time converter circuit.

Turning to FIG. 2, a block diagram of an embodiment of a digital-to-time converter circuit is depicted. As illustrated, digital-to-time converter circuit 102 includes adjustable delay circuit 201, input multiplex circuit 203, and delayed signal multiplex circuit 202.

Input multiplex circuit 203 is configured to couple, based on mode signal 209, either reference clock signal 104 or divider signal 204 to node 208 to generate signal 205. For example, in test mode, input multiplex circuit 203 is configured to couple reference clock signal 104 to node 208 to generate signal 205, while, in mission mode, input multiplex circuit 203 is configured to couple divider signal 204 to node 208 to generate signal 205.

As used and described herein, "mission mode" refers to an operating mode of a phase-locked loop circuit that generates an output clock signal using a reference clock signal, where the output clock signal frequency is a multiple of the reference clock frequency. "Test mode," on the other hand, refers to an operating mode of a phase-locked loop in which one or more circuit blocks of the phase-locked loop circuit are reconfigured for test mode, and one or more blocks are disabled or powered down in order to test particular circuit blocks included in the phase-locked loop circuit. It is noted that mission mode and test mode cannot not be enabled simultaneously. Control circuit 101 generates stimulus code 105 for either mission mode or test mode, but not for both simultaneously. Input multiplex circuit 203 selects either reference clock signal 104 (in test mode), or divider signal 204 (in mission mode), to couple to node 208 to generate signal 205

Adjustable delay circuit 201 is configured to generate phase signals 207 using signal 205 and delay adjustment signals 206. In various embodiments, adjustable delay circuit 201 includes a series of sequentially coupled delay stages (also referred to as delay elements) to form delay chains (also referred to as delay lines). The output of successive ones of the delay stages correspond to successive ones of phase signals 207. Phase signals 207 are delayed versions of signal 205. As signal 205 propagates through the multiple delay stages, each stage generates a corresponding one of phase signals 207. Each of phase signals 207 is increasingly delayed from signal 205 as it propagates through more delay stages.

Delay stages, such as those used in adjustable delay circuit 201, are configured to generate an output signal that is a delayed version of an input signal. A delay stage may employ a variety of circuit techniques for generating a given amount of delay between the input and output signals. For example, in some cases a delay stage may use one or more logic gates coupled in series. Alternatively, a delay stage may employ a current charging a capacitor, or any other suitable circuit topology for generating a delayed version of a signal.

Delayed signal multiplex circuit 202 uses stimulus code 105 to selectively couple ones of phase signals 207 to delayed signal 106. The phase signal 207 selected by stimulus code 105 corresponds with the output of a certain delay stage in the delay chain of adjustable delay circuit 201, which further corresponds with a certain delay of delayed signal 106 with respect to reference clock signal 104. In this manner, delayed signal multiplex circuit 202 uses stimulus code 105 to select by how much time reference clock signal 104 in test mode, or divider signal 204 in mission mode, is delayed by, when delayed signal multiplexer circuit 202 generates delayed signal 106.

Delayed signal multiplex circuit 202 and input multiplex circuit 203 may be implemented according to various design styles. For example, in some embodiments, these multiplex circuits may employ multiple logic gates arranged to implement the multiplex function. In other embodiments, these multiplex circuits may include two or more pass gates arranged in a wired-OR fashion.

In some embodiments, adjustable delay circuit 201 may be further adjust the delay of individual ones of the delay stages using delay adjustment signals 206. In some embodiments, the delay may be adjusted by coupling capacitors to the outputs of the delay stages, in response to delay adjustment signals 206. By coupling one or more capacitors to an output of a delay stage, the rise and fall times of the delay stage output signal are increased, thereby increasing the time for the signal to reach a trip point of a next delay stage. In this way, the time delay of the delay stages contained in adjustable delay circuit 201 may be adjusted independently by delay adjustment signals 206, so that every delay stage may have different delays than other delay stages. In various embodiments, this may be done by coupling capacitors between the outputs of the delay stages and ground, with the delay adjustment signals 206 selecting the value of the capacitance at the output of the delay stages. The capacitors connected to the delay stage outputs may be of different values, allowing adjustable delay circuit 201 to adjust the capacitor value in smaller increments, thereby allowing more fine-tuned adjustment of the delay in the adjustable delay circuit 201 delay stages. As noted above, results of the linearity measurements may be saved and used later. For example, based on the linearity measurements, the delay through one or more stages of adjustable delay circuit 201 may be modified by adjusting, using delay adjustment signals 206, the capacitive load at the output on the one or more delay stages. Although delay adjustment signals 206 are depicted as adjusting delay by the addition or removal of capacitors, in other embodiments, delay adjustment signals 206 may be used to adjust delay in other ways (e.g., adjust a power supply voltage).

Figure 3:
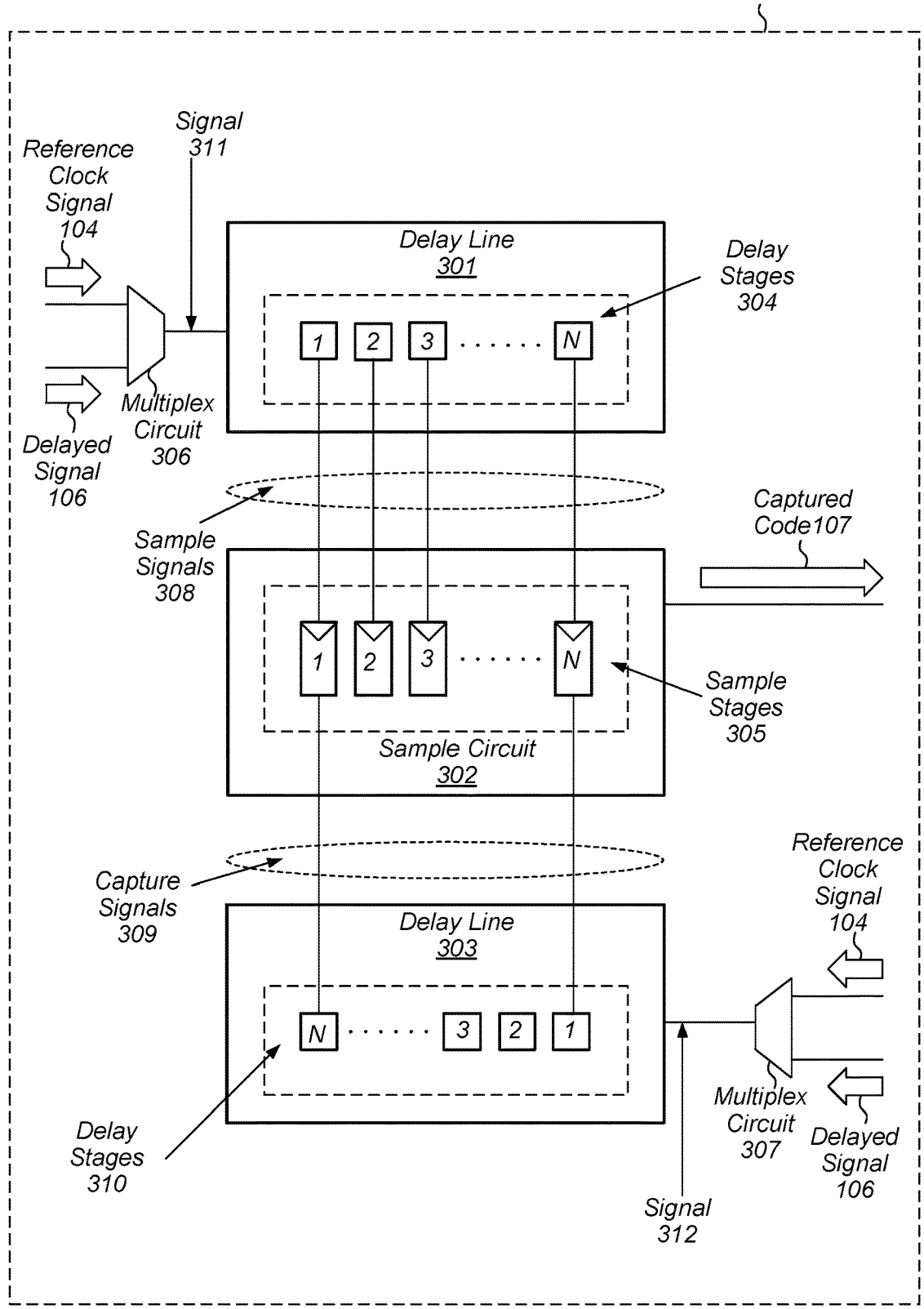
FIG. 3 illustrates a block diagram of an embodiment of a time-to-digital converter circuit.

FIG. 3 is a block diagram of an embodiment of a time-to-digital converter circuit. As illustrated, time-to-digital converter circuit 103 includes multiplex circuit 306, delay line 301, sample circuit 302, delay line 303, and multiplex circuit 307. Time-to-digital converter circuit 103 is configured to determine the delay from reference clock signal 104 to delayed signal 106, and to generate captured code 107, which encodes the value of the delay from reference clock signal 104 to delayed signal 106, when a delay measurement cycle is complete. It is noted that there are alternative circuit topologies that may be employed for implementing a time-to-digital converter circuit, and that such alternative circuit topologies may also be used with the disclosed linearity test scheme.

Multiplex circuit 306 is configured to selectively couple either reference clock signal 104 or delayed signal 106 to generate signal 311. Multiplex circuit 307 is configured to selectively couple either reference clock signal 104 or delayed signal 106 to generate signal 312. It is noted that in various embodiments, signals 311 and 312 are mutually exclusive to each other. For example, if multiplex circuit 306 couples reference clock signal 104 to generate signal 311, then multiplex circuit 307 will couple delayed signal 106 to signal 312. Conversely, if multiplex circuit 306 selectively couples delayed signal 106 to generate signal 311, then multiplex circuit 307 will selectively couple reference clock signal 104 to generate signal 312.

Delay line 301 is configured to generate sample signals 308 using signal 311. Sample signals 308 are a sequential series of successively increasing delays of signal 311 as it propagates through delay line 301 from 1 to N. Delay line 301 includes a series of sequentially connected delay stages 304. Output signals of successive ones of delay stages 304 correspond to successive ones of sample signals 308, which are coupled to the clock inputs of successive ones of sample stages 305.

Delay line 303 is configured to generate capture signals 309 using signal 312. Capture signals 309 are a sequential series of successively increasing delays of signal 312 as it propagates through delay line 303 from 1 to N. Delay line 303 includes a series of sequentially connected delay stages 310. Output signals of successive ones of delay stages 310 correspond to successive ones of capture signals 309, which are coupled to the data inputs of successive ones of sample stages 305.

It is noted that, in some embodiments, all delay stages 304 outputs, corresponding to all sample signals 308, and that all delay stages 310 outputs, corresponding to all captured signals 309, are initialized to a low logic value before a time-to-digital converter circuit linearity test begins. It is further noted that the outputs of all delay stages in adjustable delay circuit 201 may be initialized to a low logic level as well.

At the beginning of an example of a time-to-digital converter circuit linearity test, multiplex circuit 306 selects reference clock signal 104 to couple to signal 311, and multiplex circuit 307 selects delayed signal 106 to couple to signal 312. Reference clock signal 104 will begin propagating through sequential delay stages 304 of delay line 301, starting at the first of delay stages 304, and will continue to propagate through the delay line 301 until the end of delay line 301 has been reached. At the same time, delayed signal 106 will begin propagating through sequential delay stages 310 of delay line 303, starting at the first of delay stages 310, and will continue to propagate through the delay line 303 until the end of delay line 303 has been reached. It is noted that signal 312 propagates through delay line 303 in the opposite direction that signal 311 propagates through delay line 301, as depicted in FIG. 3

As reference clock signal 104 propagates through delay line 301, the delay stages 304 outputs, which correspond to sample signals 308, will start asserting the clock inputs of the sample stage 305 registers, starting with sample stages 305, number 1, and continuing to sample stages 305, number N. At the same time, as delayed signal 106 propagates through delay line 303 from delay stages 310 numbers 1 to N, captured signals 309, corresponding to the outputs of the delay stages 310, will start asserting the data inputs of sample stages 305 registers, starting with sample stages 305, number N, and continuing to sample stages 305, number 1.

Delayed signal 106 will begin propagating through delay line 303 at a certain delay after reference clock signal 104 begins propagating through delay line 301. This delay is determined by adjustable delay circuit 201 and stimulus code 105 as described above. As noted above, reference clock signal 104 and delayed signal 106 are propagating through delay line 301 and delay line 303 starting from opposite sides (signal 311 vs. signal 312), and in opposite directions. As signal 311 propagates through delay line 301, each of the delay stages 304 generates a corresponding one of sample signals 308. In a similar fashion, as signal 312 propagates through delay line 303, each of delay stages 310 generates a corresponding one of capture signals 309.

As different ones of sample signals 308 are asserted, corresponding ones of sample stages 305 are activated, sampling respective states of captured signals 309. For example, when an initial one of sample signals 308 is asserted, an initial sample stage (denoted as "1") of sample stages 305 will capture a value of a final one of capture signals 309. Based on the delay between signals 311 and 312, sample stages 305 will capture different values. After a period of signals 311 and 312 has elapsed, the contents of sample stages 305 (denoted as captured code 107) can be read of sample stages 305. In various embodiments, a value of captured code 107 may correspond to a delay between signals 311 and 312.

Control circuit 101 is configured to compare captured code 107 to the stimulus code 105 that generated it. If they match, then the time-to-digital converter circuit 103 is considered linear for that value of the delay from reference clock signal 104 to delayed signal 106, and the control circuit will start the next sequence with a next stimulus code 105. If they do not match, the test may be run again until a value of delay adjustment signals 206 is determined that will cause captured code 107 to match stimulus code 105. In various embodiments, the loop of the linearity test, and adjusting the delay adjustment signals 206, may be run until stimulus code 105 and captured code 107 match for all values of stimulus code 105 of interest.

Figure 4:
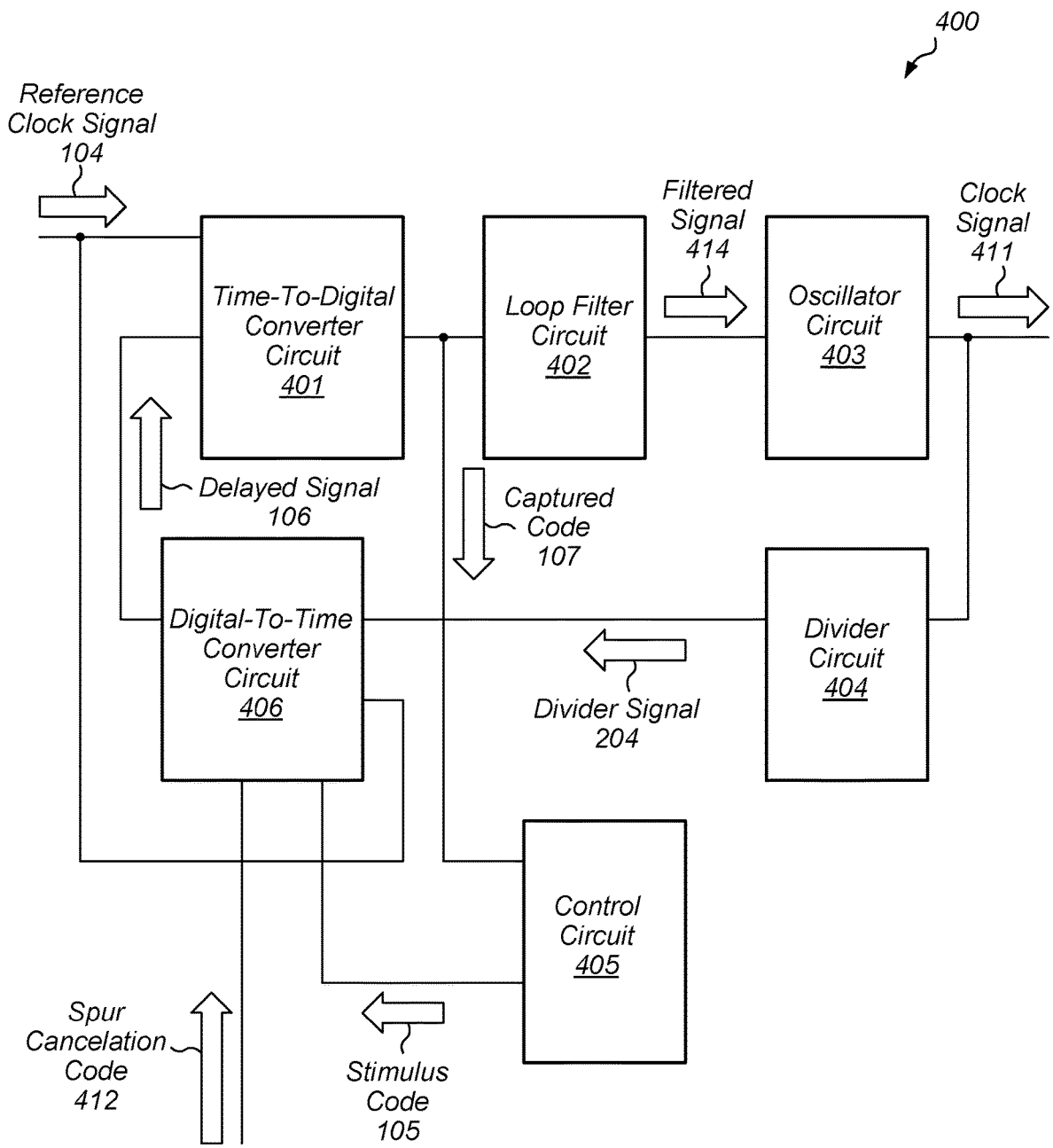
FIG. 4 illustrates a block diagram of an embodiment of a phase-locked loop circuit.

FIG. 4 is a block diagram of an embodiment of a phase-locked loop circuit. As illustrated, phase-locked loop circuit 400 includes time-to-digital converter circuit 401, loop filter circuit 402, oscillator circuit 403, divider circuit 404, control circuit 405, and digital-to-time converter circuit 406. The linearity of time-to-digital converter circuit 401 may be tested as depicted in FIG. 1.

Phase-locked loop circuit 400 may, in some embodiments, be configured to combine digital-to-time converter circuit 406 with time-to-digital converter circuit to reduce the magnitude of spurious signals caused by fractional-N operation during mission mode using spur cancelation code 412. Phase-locked loop circuit 400 may also be configured, in test mode, to couple digital-to-time converter circuit 406 and time-to-digital converter circuit 401 in a loop in order to test the linearity of time-to-digital converter circuit 401, as depicted in FIG. 1.

Control circuit 405 is configured to generate stimulus code 105 for both test mode and mission mode. As described above, digital-to-time converter circuit 406 is configured to delay reference clock signal 104 by a time specified by stimulus code 105, thus generating delayed signal 106.

As described above, time-to-digital converter circuit 401 is configured to generate captured code 107, corresponding to the measured time delay between reference clock signal 104 and delayed signal 106. In mission mode, captured code 107 is filtered by loop filter circuit 402 to generate filtered signal 414. Signal 414 in turn controls the speed of oscillator circuit 403, which generates clock signal 411 for feedback to divider circuit 404. In test mode, control circuit 405 compares stimulus code 105 with captured code 107, and uses the result to generate the next value of stimulus code 105. It is noted that during mission mode, control circuit 405 may be left enabled and may be configured to gather data during mission mode. Data gathered during mission mode may also be used for calibration purposes.

Control circuit 405 is further configured to compare respective values of ones of stimulus code 105 with corresponding ones of captured code 107. As described further below, the results of these comparisons may be used either to adjust the value of delay adjustment signals 206, or to generate the next value of stimulus code 105.

It is noted that different algorithms may be used by control circuit 405 in test mode, than in mission mode, to generate the next value of stimulus code 105. It is further noted that in test mode, loop filter circuit 402, oscillator circuit 403, and divider circuit 404 may be disabled or powered down in order to reduce noise and save power.

Figure 5:
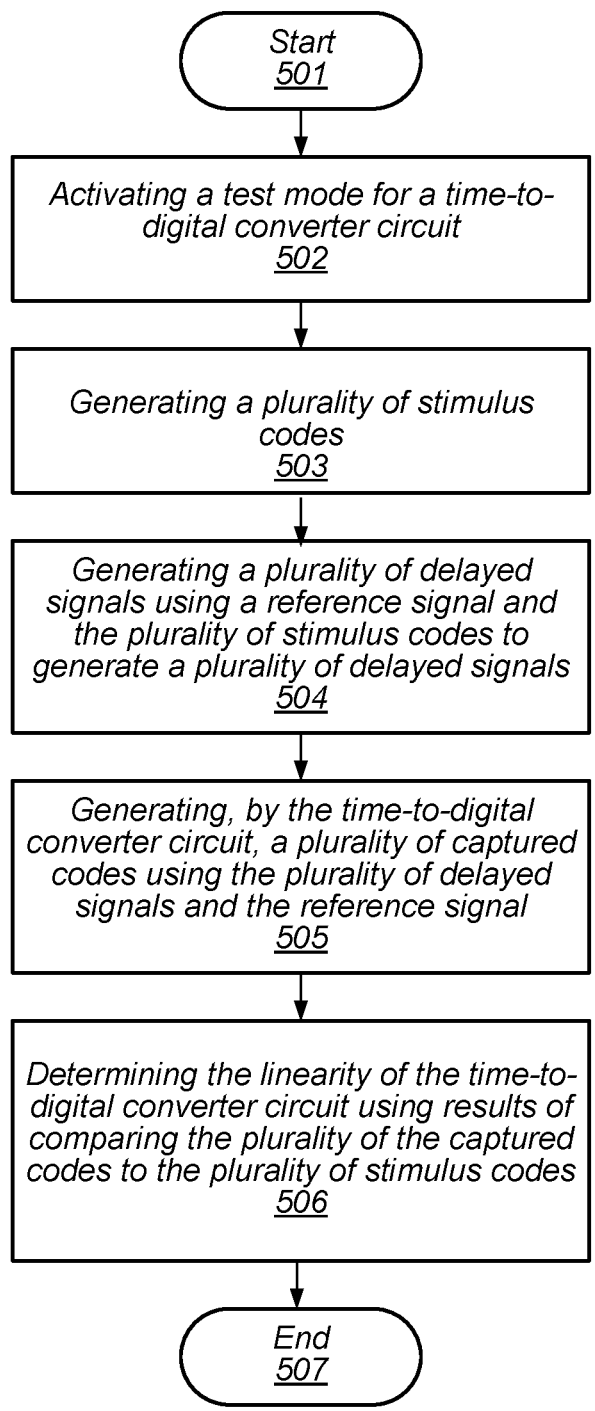
FIG. 5 illustrates a flow diagram of an embodiment of a method for testing a time-to-digital converter circuit.

FIG. 5 illustrates a flow diagram depicting an embodiment of a method for testing a time-to-digital converter circuit linearity. The method, which may be applied to various time-to-digital converter circuit linearity test systems, (e.g. time-to-digital linearity test circuit 100), begins in block 501.

The method includes activating a test mode (block 502) for a time-to-digital converter circuit. In various embodiments, the test mode may be activated during a startup procedure of phase-locked loop circuit 400 or during a reset of phase-locked loop circuit 400.

The method further includes the control circuit generating a plurality of stimulus codes (block 503). In various embodiments, the stimulus codes may include multiple bits whose values may correspond to a desired amount of delay to be between delayed signals and a reference clock signal.

The method also includes generating a plurality of delay signals using the reference clock signal and the plurality of stimulus codes to generate a plurality of delayed signals (block 504). In some embodiments, a digital-to-time converter circuit may be employed to generate the delayed signals, and a delay between the reference clock signal and a given one of the plurality of delayed signals is specified by a corresponding one of the plurality of stimulus codes.

The method further includes generating, by the time-to-digital converter circuit, a plurality of captured codes, using the plurality of delayed signals and the reference clock signal (block 505). In various embodiments, a given one of the captured codes is indicative of a delay between a corresponding one of the plurality of delayed signals and the reference clock signal. In some cases, generating the plurality of delayed signals includes generating a plurality of phase signals using the reference clock signal and selecting, using a particular stimulus code of the plurality of stimulus codes, a corresponding phase signal of the plurality of phase signals as a particular delayed signal of the plurality of delayed signals. It is noted that a delay between a given phase signal and a subsequent phase signal corresponds to a given one of a plurality of time periods.

As described above, a number of bits included in a given stimulus code may be different than a number of bits included in a corresponding captured code. To compare the captured codes to the stimulus codes, the captured codes may be scaled. In such cases, generating the plurality of captured codes includes scaling a given capture code of the plurality of capture codes, and encoding the scaled captured code.

The method also includes determining the linearity of the time-to-digital converter circuit using results of comparing the plurality of the captured codes to the plurality of the stimulus codes (block 506). In some cases, determining the linearity of the time-to-digital converter circuit includes generating a range of possible code values for a particular stimulus code of the plurality of stimulus codes, and comparing a particular captured code of the plurality of captured codes, that corresponds to the particular stimulus code, to the range of possible code values. The method concludes in block 507.

Figure 6:
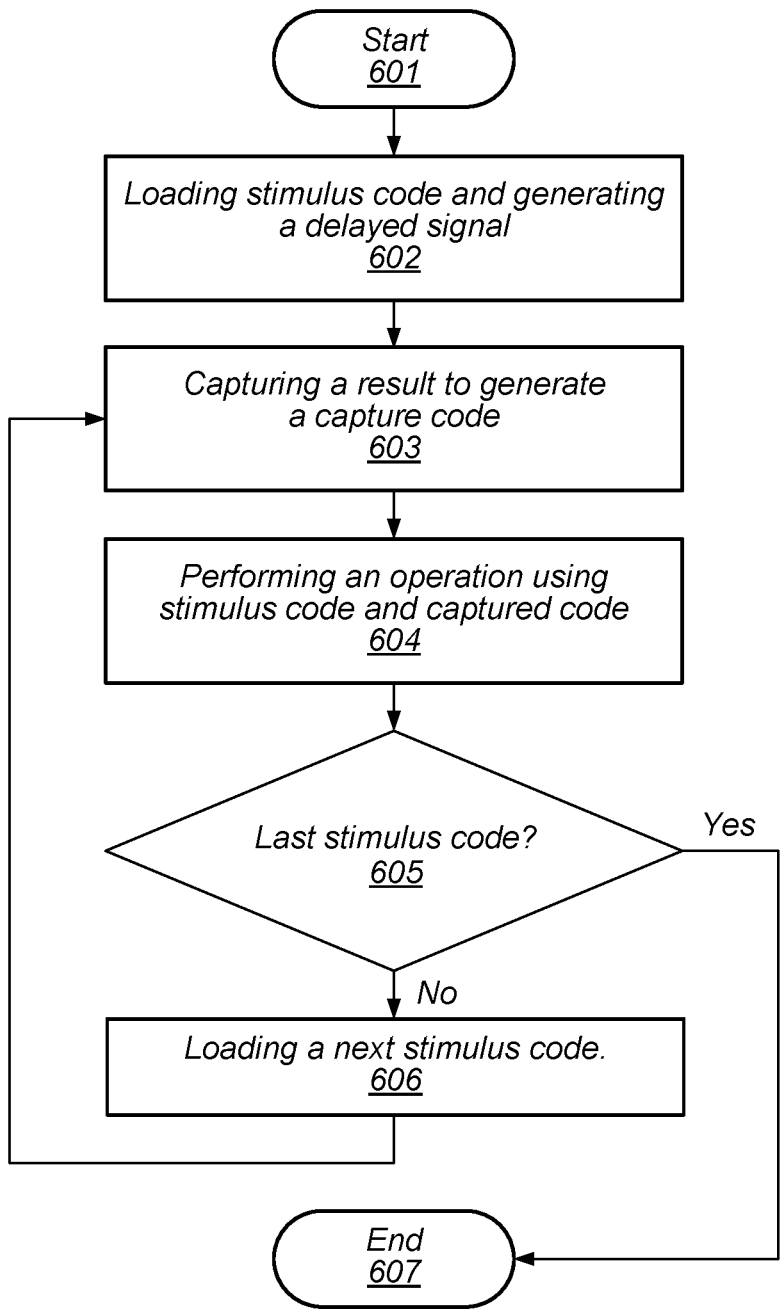
FIG. 6 illustrates a flow diagram of an embodiment of a method for testing a time-to-digital converter circuit using multiple stimulus codes.

FIG. 6 illustrates a flow diagram depicting an embodiment of a method for a loop to perform an operation on a series of stimulus code values, and the corresponding capture code values that they generate. The method, which may be included as part of the method depicted in FIG. 5, begins in block 601

The method includes loading a stimulus code and generating a delayed signal (block 602). In various embodiments, the stimulus code may correspond to an amount by which a digital-to-time converter circuit delays a reference clock signal to generate a delayed signal. It is noted that a number of bits included in the stimulus code may be based on a total amount of delay that can be generated by the digital-to-time converter circuit.

The method also includes capturing a result to generate a capture code (block 603). As described above, the delayed signal sampled by a time-to-digital converter circuit using the reference clock signal. The time-to-digital converter circuit generates the capture code such that a value of the capture code is indicative of an amount of delay between the delayed signal and the reference clock signal. It is noted that the capture code may include any suitable number of bits, which may be different than a number of bits included in the stimulus code.

The method further includes performing an operation using the stimulus code and captured code (block 604). In various embodiments, the operation may include comparing the stimulus code and the capture code. In cases where the number of bits included in the stimulus code is different than the number of bits included in the capture code, the method may include scaling the capture code (and/or the stimulus code). In other cases, the method may include generating a range of allowable values using the stimulus code, and comparing the capture code to the range of allowable values.

The method then depends on a state of the stimulus code (block 605). In response to determining that the previously loaded stimulus code is a last stimulus code, the method concludes in block 607. Alternatively, in response to determining that the previous loaded stimulus code is not the last stimulus code, the method includes loading a next stimulus code (block 606). The method then continues from block 603 as described above.

Figure 7:
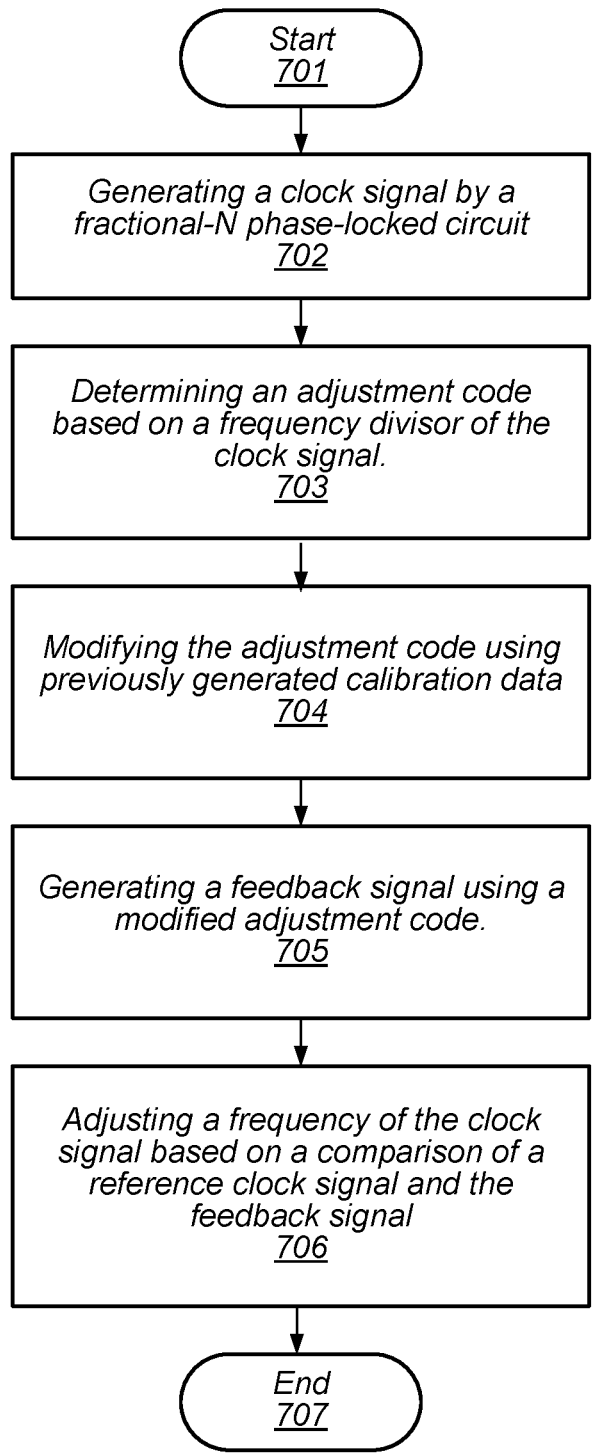
FIG. 7 illustrates a flow diagram of an embodiment of a method for operating a phase-locked loop circuit using calibration data.

FIG. 7 illustrates a flow diagram of an embodiment of a method for operating a phase-locked loop circuit using calibration data. The method, which may be applied to various phase-locked loop circuits (e.g. phase-locked loop circuit 400), begins in block 701.

The method includes generating a clock signal by a fractional-N phase-locked loop circuit (block 702). In various embodiments, the clock signal may be generated by an oscillator circuit included in the fractional-N phase-locked loop circuit that includes a digital-to-time converter circuit and a time-to-digital converter circuit.

The method further includes determining an adjustment code based on a frequency divisor of the clock signal (block 703). The adjustment code may, in some embodiments, be applied to the digital-to-time converter to compensate for non-linearity in the time-to-digital converter circuit. In various embodiments, the frequency divisor may include both integer and fractional components. In such cases, both the integer and fractional components may be used in determining the adjustment code.

The method also includes modifying the adjustment code using previously generated calibration data (block 704). As described above, circuit blocks (e.g., a time-to-digital converter circuit) may be tested during a test mode, during which calibration data may be gathered. In some cases, the method may further include comparing the adjustment code to the calibration data and, in response to determining that a current value of the adjustment code is in a non-linear response region of the time-to-digital converter circuit, modifying the adjustment code.

The method also includes generating a feedback signal using a modified adjustment code (block 705). The feedback signal may, in various embodiments, be sent to the time-to-digital converter circuit. In some embodiments, generating the feedback signal includes dividing a frequency of the clock signal to generate a reduced-frequency clock signal, and delaying, by an amount of time specified by the modified adjustment code, the reduced-frequency clock signal to generate the feedback signal.

The method further includes adjusting a frequency of the clock signal based on a comparison of a reference clock signal and the feedback signal (block 706). Adjusting the frequency of the clock signal may include comparing, using a time-to-digital converter circuit, the feedback signal to the reference clock signal to generate control bits. The method may also include filtering the control bits, and adjusting the frequency of the clock signal using filtered control bits. The method concludes in block 707.

Figure 8:
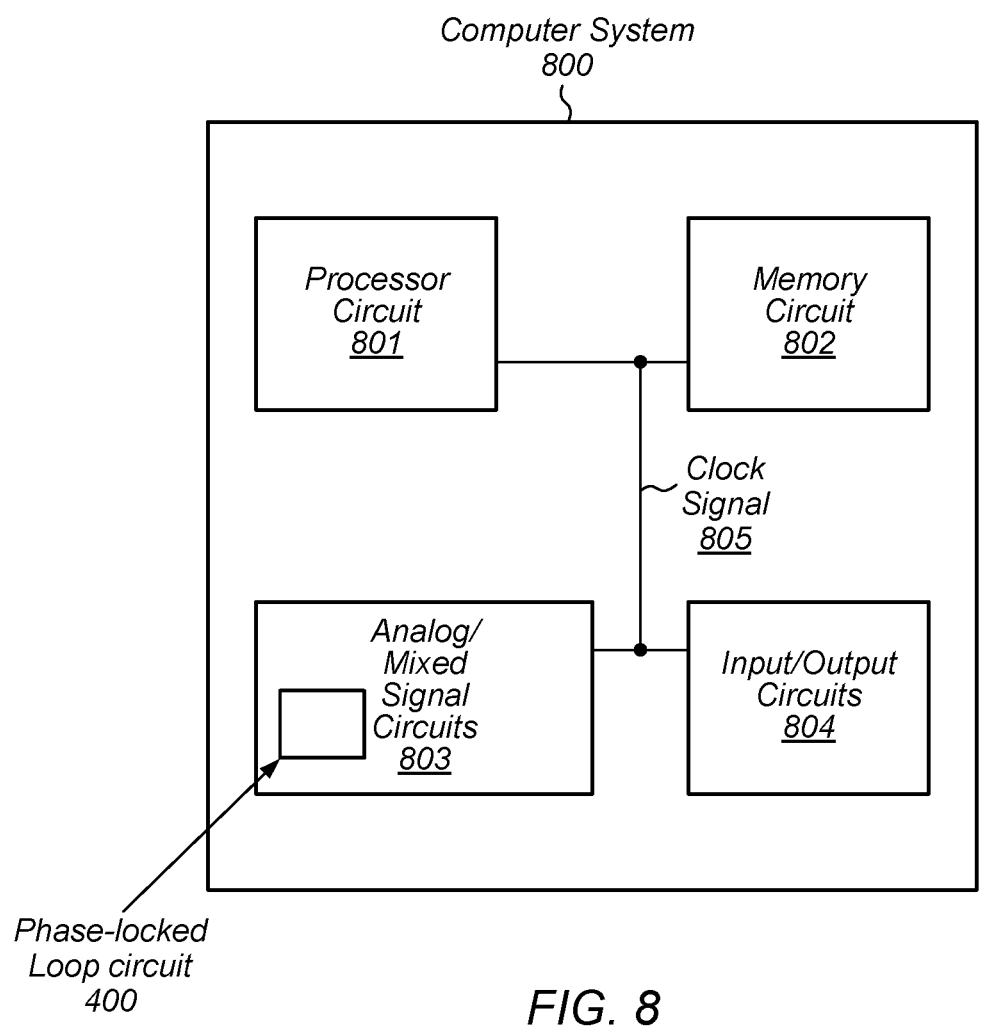
FIG. 8 illustrates a block diagram of an embodiment of a system-on-a-chip.

A block diagram of system-on-a-chip (SoC) is illustrated in FIG. 8. As illustrated embodiment, the SoC 800 includes processor circuit 801, memory circuit 802, analog/mixed-signal circuits 803, and input/output circuits 804, each of which is coupled to communication bus 805. As described below, SoC 800 may be configured for use in a desktop computer, server, or in a mobile computing application such as, a tablet, laptop computer, or wearable computing device.

Processor circuit 801 may, in various embodiments, be representative of a general-purpose processor that performs computational operations. For example, processor circuit 801 may be a central processing unit (CPU), a graphics processing unit (GPU), a microcontroller, or the like, implemented as an application-specific integrated circuit (ASIC), or a field-programmable gate array (FPGA), etc. In some embodiments, processor circuit 801 may interface to memory circuit 802, analog/mixed-signal circuits 803, and input/output circuits 804 via communication bus 805.

Memory circuit 802 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that in the embodiment of an SoC in FIG. 8, a single memory circuit is depicted. In other embodiments, any suitable number of memory circuits may be employed.

Analog/mixed-signal circuits 803 includes a variety of circuits including phase-locked loop circuit 400 as depicted in FIG. 4. Additionally, analog/mixed-signal circuits 803 may include a crystal oscillator circuit, an analog-to-digital converter (ADC) circuit, and a digital-to-analog converter (DAC) circuit (all not shown). In other embodiments, analog/mixed-signal circuits 803 may be configured to perform power management tasks with the inclusion of on-chip power supplies and voltage regulators.

Input/output circuits 804 may be configured to coordinate data transfer between SoC 800 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 804 may be configured to implement a version of Universal Serial Bus (USB) protocol or IEEE 1394 (Firewire®) protocol.

Input/output circuits 804 may also be configured to coordinate data transfer between SoC 800 and one or more devices (e.g., other computing systems or integrated circuits) coupled to SoC 800 via a network. In one embodiment, input/output circuits 804 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 804 may be configured to implement multiple discrete network interface ports.

Figure 9:
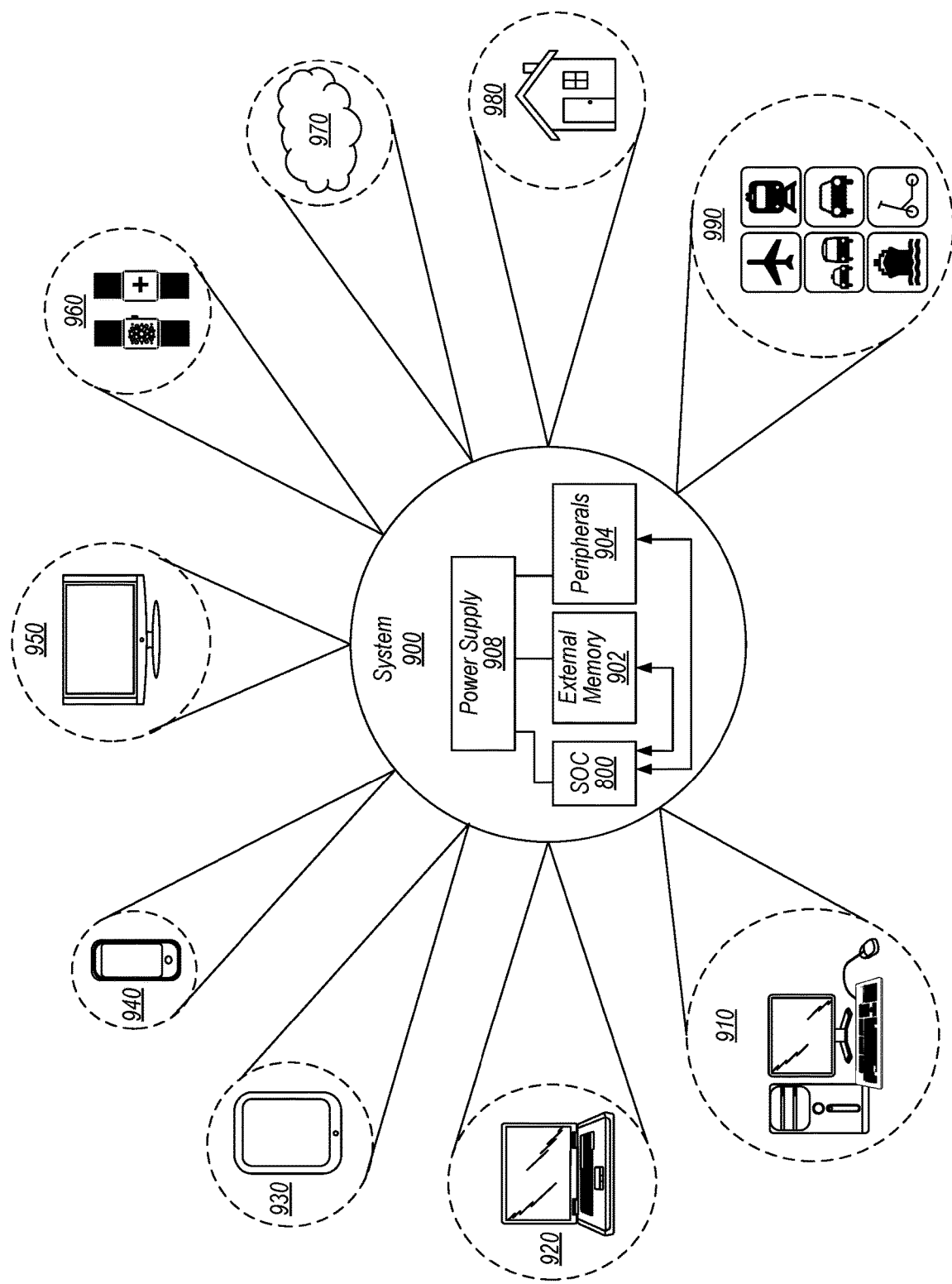
FIG. 9 illustrates a block diagram of an embodiment of a system.

Turning next to FIG. 9, a block diagram of one embodiment of a system 900 is shown that may incorporate and/or otherwise utilize the methods and mechanisms described herein. In the illustrated embodiment, the system 900 includes at least one instance of system-on-a-chip (SoC) 800 as depicted in FIG. 8. In various embodiments, SoC 800 is coupled to external memory 902, peripherals 904, and power supply 908. In some embodiments, more than one instance of SoC 800 is included (and more than one external memory 902 is included as well).

A power supply 908 is also provided which supplies the supply voltages to SoC 800 as well as one or more supply voltages to the external memory 902 and/or the peripherals 904. In various embodiments, power supply 908 represents a battery (e.g., a rechargeable battery in a smart phone, laptop or tablet computer, or other devices).

The external memory 902 is any type of memory, such as dynamic random-access memory (DRAM), synchronous DRAM (SDRAM), double-data-rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 904 include any desired circuitry, depending on the type of system 900. For example, in one embodiment, peripherals 904 includes devices for various types of wireless communication, such as Wi-Fi, Bluetooth, cellular, global positioning system, etc. In some embodiments, the peripherals 904 also include additional storage, including RAM storage, solid state storage, or disk storage. The peripherals 904 include user interface devices such as a display screen, including touch display screens or multi-touch display screens, keyboard or other input devices, microphones, speakers, etc.

As illustrated, system 900 is shown to have application in a wide range of areas. For example, system 900 may be utilized as part of the chips, circuitry, components, etc., of a desktop computer 910, laptop computer 920, tablet computer 930, cellular or mobile phone 940, or television 950 (or set-top box coupled to a television). Also illustrated is a smartwatch and health monitoring device 960. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 900 may further be used as part of a cloud-based service(s) 970. For example, the previously mentioned devices, and/or other devices, may access computing resources in the cloud (i.e., remotely located hardware and/or software resources). Still further, system 900 may be utilized in one or more devices of a home 980 other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner.

Also illustrated in FIG. 9 is the application of system 900 to various modes of transportation 990. For example, system 900 may be used in the control and/or entertainment systems of aircraft, trains, buses, cars for hire, private automobiles, waterborne vessels from private boats to cruise liners, scooters (for rent or owned), and so on. In various cases, system 900 may be used to provide automated guidance (e.g., self-driving vehicles), general systems control, and otherwise. These and many other embodiments are possible and are contemplated. It is noted that the devices and applications illustrated in FIG. 9 are illustrative only and are not intended to be limiting. Other devices are possible and are contemplated.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such as "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of elements. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
    a control circuit configured to generate a plurality of stimulus codes in response to an activation of a test mode;
    a digital-to-time converter circuit configured to generate a delayed signal using a reference clock signal and a given stimulus code of the plurality of stimulus codes;
    a time-to-digital converter circuit configured to sample the delayed signal using the reference clock signal to generate a captured code indicative of a delay between delayed signal and the reference clock signal; and
    wherein the control circuit is further configured to:
        perform a test operation using the given stimulus code and the captured code; and
        determine a test result using results of the test operation.

2. The apparatus of claim 1, wherein the test operation includes a linearity test of the time-to-digital converter circuit.

3. The apparatus of claim 1, wherein to perform the test operation, the control circuit is further configured to:
    generate a range of possible code values using the given stimulus code and a tolerance value that indicates a width of the range of possible code values; and
    compare the captured code to a minimum value included in the range of possible code values and a maximum value included in the range of possible code values.

4. The apparatus of claim 1, wherein to sample the delayed signal, the time-to-digital converter circuit is further configured to:
    generate a plurality of sample signals using the reference clock signal;
    generate a plurality of capture signals using the delayed signal; and
    sample the plurality of capture signals using first plurality of sample signals to generate the captured code.

5. The apparatus of claim 1, wherein to delay the reference clock signal, the digital-to-time converter circuit is further configured to:
    generate a plurality of phases using the reference clock signal, wherein each phase is delayed from the reference clock signal by a corresponding one of a plurality of time periods; and
    select, using the given stimulus code, a particular one of the plurality of phases as the delayed signal.

6. The apparatus of claim 1, wherein to generate the delayed signal, the time-to-digital converter circuit is further configured to decode the given stimulus code.

7. A method, comprising:
    activating a test mode for a time-to-digital converter circuit;
    in response to activating the test mode:
        generating a plurality of stimulus codes;
        generating, by a digital-to-time converter circuit, a plurality of delayed signals using a reference clock signal and the plurality of stimulus codes, wherein a delay between the reference clock signal and a given one of the plurality of delayed signals is specified by a corresponding one of the plurality of stimulus codes;
        generating, by the time-to-digital converter circuit, a plurality of captured codes using the plurality of delayed signals and the reference clock signal, wherein a given one of the captured codes is indicative of a delay between a corresponding one of the plurality of delayed signals and the reference clock signal; and
        determining a linearity of the time-to-digital converter circuit using results of comparing the plurality of the captured codes to the plurality of stimulus codes.

8. The method of claim 7, wherein determining the linearity of the time-to-digital converter circuit includes:
    generating a range of possible code values for a particular stimulus code of the plurality of stimulus codes; and
    comparing a particular captured code of the plurality of captured codes to the range of possible code values, wherein the particular captured code corresponds to the particular stimulus code.

9. The method of claim 7, wherein generating the plurality of delayed signals includes:
    generating a plurality of phase signals using the reference clock signal, wherein a delay between a given phase signal and a subsequent phase signal corresponds to a given one of a plurality of time periods; and
    selecting, using a particular stimulus code of the plurality of stimulus codes, a corresponding phase signal of the plurality of phase signals as a particular delayed signal of the plurality of delayed signals.

10. The method of claim 9, wherein generating the plurality of delayed signals includes:
    decoding a given stimulus code of the plurality of stimulus codes to generate a decoded value; and
    selecting, using the decoded value, the corresponding phase signal of the plurality of phase signals as the particular delayed signal.

11. The method of claim 7, wherein generating the plurality of captured codes includes:
    scaling a given captured code of the plurality of captured codes; and
    encoding a scaled captured code.

12. The method of claim 7, wherein generating the plurality of capture codes includes:
    generating a first plurality of sample signals using the reference clock signal;
    generating a first plurality of capture signals using a given delayed signal of the plurality of delayed signals, wherein a delay between a given capture signal and a subsequent capture signal corresponds to a given one of a plurality of time periods; and sampling the first plurality of capture signals using the first plurality of sample signals to generate a first subset of the plurality of captured codes.

13. The method of claim 12, further comprising:

generating a second plurality of sample signals using a given delayed signal of the plurality of delayed signals;

generating a second plurality of capture signals using the reference clock signal; and sampling the second plurality of capture signals using the second plurality of sample signals to generate a second subset of the plurality of captured codes.

14. An apparatus, comprising:

a phase-locked loop circuit including a time-to-digital converter circuit and a digital-to-time converter circuit; and a control circuit configured, in response to an activation of a test mode, to generate a plurality of stimulus codes;

wherein the digital-to-time converter circuit is configured to generate a plurality of delayed signals using a reference clock signal and the plurality of stimulus codes to generate a plurality of delayed signals, wherein a delay between the reference clock signal and a given one of the plurality of delayed signals is specified by a corresponding one of the plurality of stimulus codes;

wherein the time-to-digital converter circuit is configured to generate a plurality of captured codes using the plurality of delayed signals and the reference clock signal, wherein a given one of the captured codes is indicative of a delay between a corresponding one of the plurality of delayed signals and the reference clock signal; and wherein the control circuit is further configured to determine a linearity of a response of the time-to-digital converter circuit, using results of comparing the plurality of the captured codes to the plurality of stimulus codes.

15. The apparatus of claim 14, wherein to determine the linearity of the time-to-digital converter circuit, the control circuit is further configured to:

generate a range of possible code values for a particular stimulus code of the plurality of stimulus codes; and compare a particular captured code of the plurality of captured codes to the range of possible code values, wherein the particular captured code corresponds to the particular stimulus code.

16. The apparatus of claim 15, wherein to generate the plurality of delayed signals, the digital-to-time converter circuit is further configured to:

generate a plurality of phase signals using the reference clock signal, wherein a delay between a given phase signal and a subsequent phase signal corresponds to a given one of a plurality of time periods; and select, using a particular stimulus code of the plurality of stimulus codes, a corresponding phase signal of the plurality of phase signals as a particular delayed signal of the plurality of delayed signals.

17. The apparatus of claim 16, wherein to generate the plurality of delayed signals, the digital-to-time converter circuit is further configured to:

decode a given stimulus code of the plurality of stimulus codes to generate a decoded value; and select, using the decoded value, the corresponding one of the plurality of phase signals as the particular delayed signal.

18. The apparatus of claim 16, wherein to generate the plurality of captured codes, the time-to-digital converter circuit is further configured to:

scale a given captured code of the plurality of captured codes; and encode a scaled captured code.

19. The apparatus of claim 18, wherein to generate the plurality of capture codes, the time-to-digital converter circuit is further configured to:

generate a first plurality of sample signals using the reference clock signal;

generate a first plurality of capture signals using a given delayed signal of the plurality of delayed signals, wherein a delay between a given capture signal and a subsequent capture signal corresponds to a given one of a plurality of time periods; and sample the first plurality of capture signals using the first plurality of sample signals to generate a first subset of the plurality of captured codes.

20. The apparatus of claim 17, wherein the phase-locked loop circuit includes a feedback loop, and wherein the phase-locked loop circuit is further configured to open the feedback loop in response to the activation of the test mode.

* * * * *